United States Patent
Shieh et al.

(10) Patent No.: US 9,424,914 B2
(45) Date of Patent: Aug. 23, 2016

(54) RESISTIVE MEMORY APPARATUS AND MEMORY CELL THEREOF

(71) Applicant: Winbond Electronics Corp., Taichung (TW)

(72) Inventors: Ming-Huei Shieh, Cupertino, CA (US); Yuan-Mou Su, Tainan (TW); Hua-Yu Su, Milpitas, CA (US); Young-Tae Kim, San Ramon, CA (US); Douk-Hyoun Ryu, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 169 days.

(21) Appl. No.: 14/219,003

(22) Filed: Mar. 19, 2014

(65) Prior Publication Data

US 2015/0269993 A1   Sep. 24, 2015

(51) Int. Cl.
*G11C 11/00* (2006.01)
*G11C 13/00* (2006.01)

(52) U.S. Cl.
CPC .......... *G11C 13/0002* (2013.01); *G11C 13/004* (2013.01); *G11C 13/0069* (2013.01); *G11C 2013/0054* (2013.01); *G11C 2213/79* (2013.01)

(58) Field of Classification Search
CPC .......... G11C 13/0069; G11C 2213/79; G11C 13/004; G11C 13/0007; G11C 13/0002; G11C 2213/82; G11C 2013/005; G11C 13/0004
USPC .............. 365/148, 100, 189.07, 189.011, 207
See application file for complete search history.

(56) References Cited

U.S. PATENT DOCUMENTS

| | | | | |
|---|---|---|---|---|
| 8,305,795 | B2 * | 11/2012 | Azuma | G11C 13/0007 365/148 |
| 8,432,722 | B2 * | 4/2013 | Maejima | G11C 5/02 365/148 |
| 2015/0070971 | A1 * | 3/2015 | Katayama | G11C 13/004 365/148 |

FOREIGN PATENT DOCUMENTS

TW     I340388     4/2011

OTHER PUBLICATIONS

Office Action of Taiwan Counterpart Application, issued on Jun. 15, 2015, p. 1-p. 7.

* cited by examiner

*Primary Examiner* — David Lam
(74) *Attorney, Agent, or Firm* — Jianq Chyun IP Office

(57) ABSTRACT

A resistive memory apparatus and a memory cell thereof are provided. The resistive memory cell includes a first transistor, a second transistor, a first resistor and a second resistor. First and second terminals of the first transistor are respectively coupled to a first bit line and a reference voltage. First and second terminals of the second transistor are respectively coupled to a second bit line and the reference voltage. The first resistor is serially coupled on a coupling path between the first terminal of the first transistor and the first bit line, or on a coupling path between the second terminal of the first transistor and the reference voltage. The second resistor is serially coupled on a coupling path between the first terminal of the second transistor coupled and the second bit line, or on a coupling path between the second terminal of the second transistor and the reference voltage.

10 Claims, 7 Drawing Sheets

RESISTIVE MEMORY APPARATUS AND MEMORY CELL THEREOF

BACKGROUND OF THE INVENTION

1. Field of the Invention

The invention relates to a resistive memory apparatus and a memory cell thereof.

2. Description of Related Art

With increased demand for information, disposition of large capacity memory has become one of the major trends for electronic devices. A resistive memory is a popular choice in related field nowadays because it is capable of satisfying demands for sufficient capacity of lasting memory space.

The resistive memory is utilized as one of the most promising emerging non-volatile memories. This is because the resistive memory may provide higher writing speed, lower operating power, and a fabrication of the resistive memory is completely compatible with existing fabricating technology of integrated circuits.

However, in conventional art, a problem is still existed in which a difference between an impedance value being set and an impedance value being rest is unstable in a resistive memory cell. The major reason for such problem to occur that is unstable for controlling the impedance value when resetting the resistive memory cell. Such problem may lead to errors in reading data from the resistive memory cell, thereby influencing a reliability of the resistive memory.

SUMMARY OF THE INVENTION

The invention is directed to a resistive memory apparatus and a memory cell thereof, capable of effectively enhancing a sensing margin while improving a reliability thereof.

The resistive memory cell of the invention includes a first transistor, a second transistor, a first resistor and a second resistor. The first transistor has a first terminal, a second terminal, and a control terminal. The first terminal and the second terminal of the first transistor are respectively coupled to the first bit line and a reference voltage, and the control terminal receives a word line signal. The second transistor has a first terminal, a second terminal and a control terminal. The first terminal and the second terminal of the second transistor are respectively coupled to a second bit line and the reference voltage, and the control terminal of the second transistor receives the word line signal. The first resistor is serially coupled on a coupling path between the first terminal of the first transistor and the first bit line, or on a coupling path between the second terminal of the first transistor and the reference voltage. The second resistor is serially coupled on a coupling path between the first terminal of the second transistor coupled and the second bit line, or on a coupling path between the second terminal of the second transistor and the reference voltage.

The invention further provides a resistive memory apparatus, which includes a plurality of resistive memory cells, a plurality of bit lines and a plurality of source lines. The resistive memory cells are arranged in a memory array, and the memory array has a plurality of memory cell columns and a plurality of memory cell rows. The word lines are respectively coupled to the memory cell rows for respectively transmitting a plurality of word line signals. The bit line pairs are respectively coupled to the memory cell columns. The source lines are respectively coupled to the resistive memory cells. Further, the resistive memory cell includes a first transistor, a second transistor, a first resistor and a second resistor. The first transistor has a first terminal, a second terminal, and a control terminal. The first terminal and the second terminal of the first transistor are respectively coupled to the first bit line and a reference voltage, and the control terminal receives a word line signal. The second transistor has a first terminal, a second terminal and a control terminal. The first terminal and the second terminal of the second transistor are respectively coupled to a second bit line and the reference voltage, and the control terminal of the second transistor receives the word line signal. The first resistor is serially coupled on a coupling path between the first terminal of the first transistor and the first bit line, or on a coupling path between the second terminal of the first transistor and the reference voltage. The second resistor is serially coupled on a coupling path between the first terminal of the second transistor coupled and the second bit line, or on a coupling path between the second terminal of the second transistor and the reference voltage.

Based on above, the storing data in the resistive memory cell may be interpreted through the impedance states of the first resistor and the second resistor respectively transmitted from the first bit line and the second bit line in the resistive memory cell. Accordingly, the storing data in the resistive memory cell may be more accurately known by interpreting whether the first resistor and the second resistor are in a combination of different states being setting state or the resetting state being. Further, in case the impedance value of the resistor being reset cannot be effectively reset to an ideal value, a performance thereof may still be maintained by changing the impedance value of the resistor being set as to control the sensing margin of the resistive memory cell.

To make the above features and advantages of the disclosure more comprehensible, several embodiments accompanied with drawings are described in detail as follows.

DESCRIPTION OF THE EMBODIMENTS

Figure 1A:
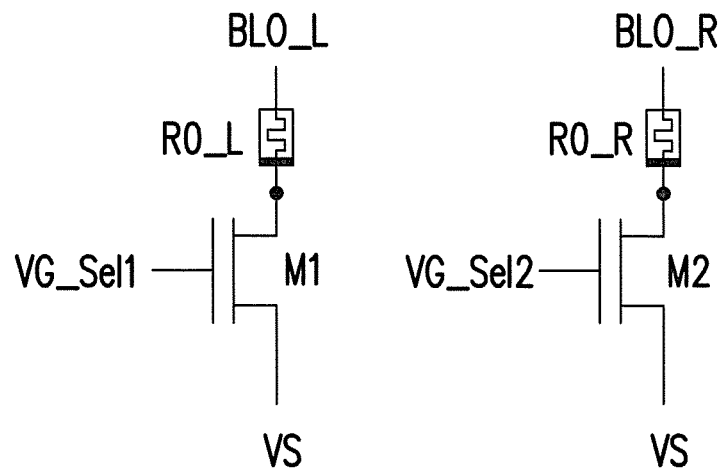
FIG. 1A is a schematic diagram illustrating a resistive memory cell according to an embodiment of the invention.

Referring to FIG. 1A, FIG. 1A is a schematic diagram illustrating a resistive memory cell according to an embodiment of the invention. A resistive memory cell 110 includes transistors M1 and M2, and resistors R0_L and R0_R. The transistor M1 includes a first terminal, a second terminal, and a control terminal, and the transistor M1 may be a metal oxide semiconductor field transistor (MOSFET). The second terminal (e.g., its source) of the transistor M1 is coupled to a reference voltage VS; the control terminal (e.g., its gate) of the transistor M1 is coupled to a word line signal VG_Sel1; the first terminal (e.g., its drain) of the transistor M1 is coupled to the resistor R0_L; and a reference voltage VS may be a source voltage. The transistor M2 includes a first terminal, a second terminal, and a control terminal, and the transistor M2 may also be a metal oxide semiconductor field transistor (MOSFET). The second terminal (e.g., its source) of the transistor M2 is coupled to the reference voltage VS; the control terminal (e.g., its gate) of the transistor M2 is coupled to a word line signal VG_Sel2; and the first terminal (e.g., its drain) of the transistor M2 is coupled to the resistor R0_R.

In the embodiment above, the transistors M1 and M2 may be a N-type metal oxide semiconductor field transistor, or may also be a P-type metal oxide semiconductor field transistor. Naturally, in other embodiments of the invention, the transistors M1 and M2 may also be a Bipolar Junction Transistor (BJT) of any types.

It should be noted that, the word line signals VG_Sel1 and VG_Sel2 respectively received by the control terminals of the transistors M1 and M2 may be the same signal transmitted from the same word line, or may be different signals transmitted by two sub word lines in one word line.

A first terminal of the resistor R0_L is coupled the first terminal of the transistor M1, and a second terminal of the resistor R0_L is coupled to a bit line BL0_L. Further, a first terminal of the resistor R0_R is coupled the first terminal of the transistor M2, and a second terminal of the resistor R0_R is coupled to a bit line BL0_R.

It should be noted that, the resistive memory cell 110 of the present embodiment may provide a storing data of one bit, or may provide a reading data of two bits. Take the resistive memory cell 110 providing the storing data of one bit as an example, a user may know of impedance states respectively provided by the resistors R0_L and R0_R through the bit line BL0_L and the bit line BL0_R. The impedance state may be used to obtain the storing data stored by the resistive memory cell 110. For instance, when an impedance provided by the resistor R0_L is of a high impedance, and an impedance provided by the resistor R0_R is of a low impedance (which is lower than an impedance value provided by the resistor R0_L), it may be interpreted that the storing data stored by the resistive memory cell 110 is of bit "0" (or bit "1"); whereas when the impedance provided by the resistor R0_L is of the low impedance, and the impedance provided by the resistor R0_R is of the high impedance, it may be interpreted that the storing data stored by the resistive memory cell 110 is of bit "0" (or bit "1").

Naturally, in other embodiments of the invention, when impedances provided by the resistors R0_L and R0_R are both of a high impedance (e.g., greater than a first threshold resistance value), the storing data stored by the resistive memory cell 110 may also be interpreted as bit "0" (or bit "1"), and when the impedances provided by the resistors R0_L and R0_R are both of a low impedance (e.g., less than a second threshold impedance value), the storing data stored by the resistive memory cell 110 may be interpreted as bit "0" (or bit "1"). Therein, the first and the second threshold impedance values for determining whether the impedances provided by the resistors R0_L and R0_R are both of the high impedance or the low impedance may be identical to or different from each other. The first and the second threshold impedance values are values determined in advance, and the first threshold impedance value is greater than the second threshold impedance value.

The determination of whether the impedance provided by the resistors R0_L and R0_R are high or low may be done by an operation in which the transistors M1 and M2 are turned on through the word lines VG_Sel0 and VG_Sel1, followed by comparing an intensity of current (or voltage) values read through the bit line BL0_L and the bit line BL0_R with a preset threshold value. This preset threshold value may be adjusted according to a variation in process parameters of the resistive memory cell 110. Accordingly, an unstable phenomenon occurred when reading the storing data of the resistive memory cell 100 may be effectively avoided.

It should be noted that, the resistive memory cell 110 of the resent embodiment knows the storing data of the resistive memory cell 110 by comparing the impedance states provided by the resistors R0_L and R0_R to each other. In other words, the resistive memory cell 110 according to the embodiments of the invention does not require to dispose a reference memory cell for providing a reference value as a basis for comparing the impedance values. Accordingly, an area and power consumption required for the reference memory cell may both be saved by utilizing a memory composed of the resistive memory cell 110 according to the embodiments of the invention, such that a cost and overall power consumption may also be saved while effectively enhancing a data reading speed of the resistive memory cell 110.

On the other hand, the transistor M1, the resistor R0_L may be separated from the transistor M2 and resistor R0_R for storing the storing data of two bits. More specifically, a combination of the transistor M1 and the resistor R0_L may be used to store the storing data of one bit, and a combination of the transistor M2 and the resistor R0_R may be used to store the storing data of another bit. When reading the resistive memory cell 110, the transistor M1 and M2 may be turned on respectively through the word lines VG_Sel0 and VG_Sel1; the impedance values of the resistors R0_L and R0_L may be interpreted according to the current on the bit line BL0_L and the bit line BL0_R; and the storing data stored by the resistive memory cell 110 being two bits may be interpreted according to whether the impedance values of the resistors R0_L and R0_L is greater than one preset threshold value, or less than another preset threshold value.

In addition, when writing data into the resistive memory cell 110, a word signal may be transmitted through the word lines VG_Sel0 and VG_Sel1 to select the resistive memory cell 110. Next, after the resistive memory cell 110 is selected, the storing data may be written by respectively setting or resetting the impedance values of the resistors R0_L and R0_R. Naturally, the impedance states of the resistors R0_L and R0_R may be decided according to the storing data to be written.

It should be noted that, when the unstable phenomenon occurred on the impedance values provided by the resistors in a resetting state, a difference between impedance values of the resistor being set and the resistor being reset may be maintained by changing the impedance value provided by the resistor in a setting state. Next, by comparing the impedance values of the resistor R0_R and R0_R in the resetting state and/or the setting state, possibility for errors occurred in reading the storing data may be effectively lowered.

Figure 1B:
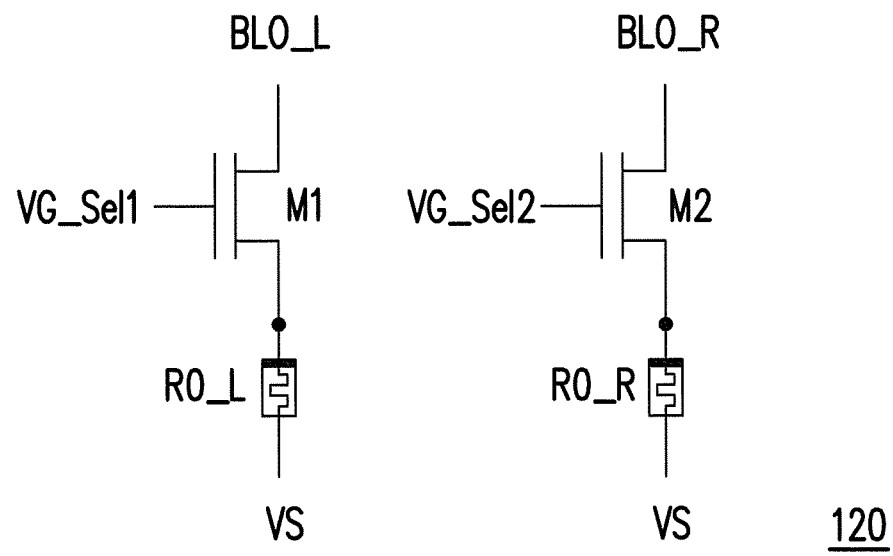
FIG. 1B is a schematic diagram illustrating a resistive memory cell according to an embodiment of the invention.

Referring to FIG. 1B, FIG. 1B is a schematic diagram illustrating a resistive memory cell according to an embodiment of the invention. A difference between a resistive memory cell 120 of FIG. 1B and the resistive memory cell 110 of FIG. 1A is that, the resistor R0_L is coupled on a coupling path between the resistor M1 and the reference voltage VS, and the resistor R0_R is coupled on a coupling path between the transistor M2 and the reference voltage VS.

Figure 2A:
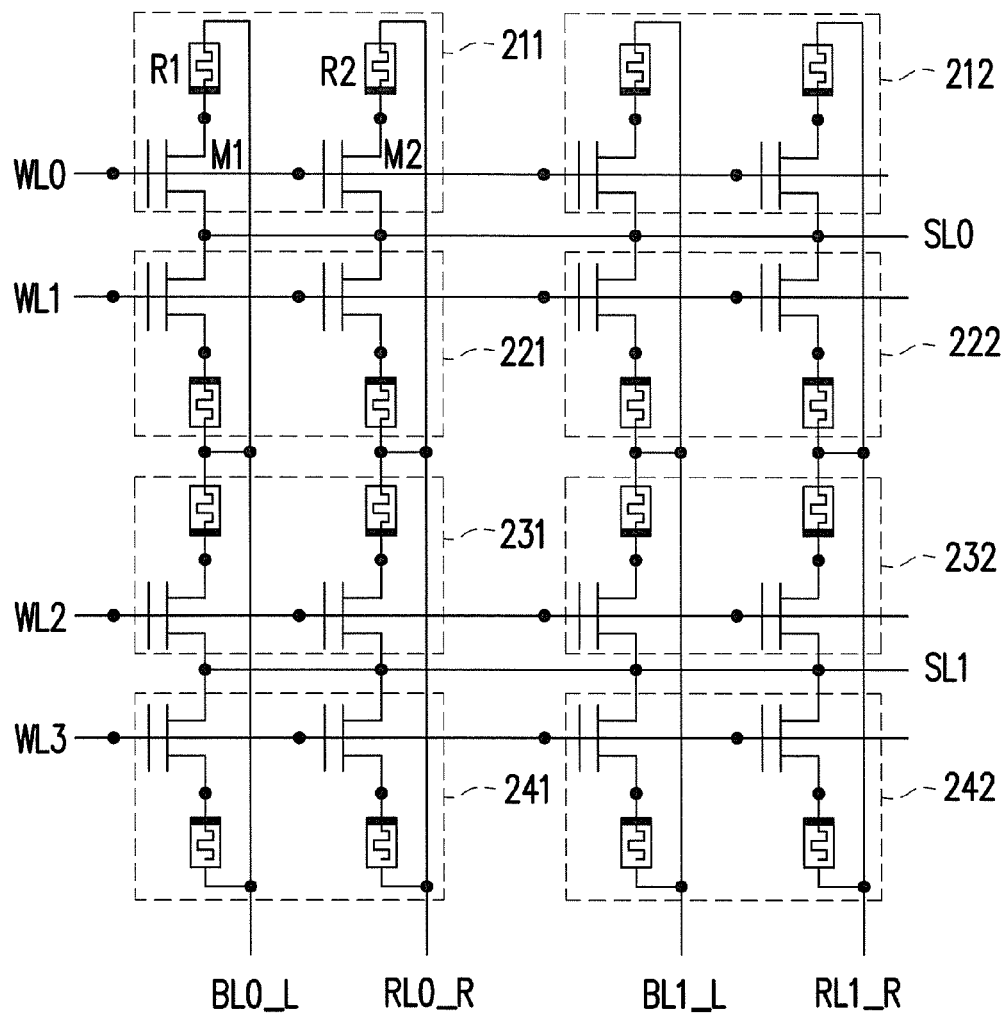
FIG. 2A is a schematic diagram illustrating a resistive memory apparatus according to an embodiment of the invention.

Referring to FIG. 2A, FIG. 2A is a schematic diagram illustrating a resistive memory apparatus according to an embodiment of the invention. A resistive memory apparatus 210 includes resistive memory cells 211 to 242, word lines WL0 to WL3 and source lines SL0 to SL1. The resistive memory cells 211 to 242 are arranged in an array to become a memory cell array. The memory cell array in 4×2 as depicted in FIG. 2 is merely an example instead of limiting the invention.

The memory cell array of FIG. 2 includes a plurality of memory cell columns and a plurality of memory cell rows. Therein, the same word lines are coupled to the same memory cell rows. More specifically, the word line WL0 is coupled to the resistive memory cells 211 and 212 of a first memory cell row; the word line WL1 is coupled to the resistive memory cells 221 and 222 of a second memory cell row; the word line WL2 is coupled to the resistive memory cells 231 and 232 of a third memory cell row; and the word line WL3 is coupled to the resistive memory cells 241 and 242 of a fourth memory cell row.

Further, in the present embodiment, the resistive memory cells of the same memory cell column are coupled to the same source line. In FIG. 2A, the memory cell column formed by the resistive memory cells 211 and 212 and the memory cell column formed by the resistive memory cells 221 and 222 are commonly coupled to the source line SL0; and the memory cell column formed by the resistive memory cells 231 and 232 and the memory cell column formed by the resistive memory cells 241 and 242 are commonly coupled to the source line SL1.

In FIG. 2A, a bit line pair is formed by the bit line BL0_L and the bit line BL0_R, and another bit line pair is formed by a bit line BL1_L and a bit line BL1_R. The bit line pair formed by the bit line BL0_L and the bit line BL0_R is coupled to the memory cell column formed by the resistive memory cells 211, 221, 231 and 241; and the bit line pair formed by the bit line BL1_L and the bit line BL1_R is coupled to the memory cell column formed by the resistive memory cells 212, 222, 232 and 242.

When reading the memory cells in the resistive memory apparatus 210, take the resistive memory cell 211 as an example, the transistors M1 and M2 are turned on through the word line WL0 to select the resistive memory cell 211, and the impedance states of the resistors R1 and R2 may be known by measuring the current transmitted on the bit lines BL0_L and BL0_R. In view of the description for the foregoing embodiment, it can be known that the storing data of one or more bits in the resistive memory cell 211 may be known by determining the impedance states of the resistors R1 and R2.

In the present embodiment, two transistors in one single resistive memory cell share one word line. When the storing data of two bits is stored in the one single resistive memory cell, the storing data of two bits may be read simultaneously when reading data. In contrast, when the storing data of one bit is stored in the one single resistive memory cell, the current on the corresponding bit line pair may be sensed simultaneously, so as to know of the storing data in the resistive memory cell.

Figure 2B:
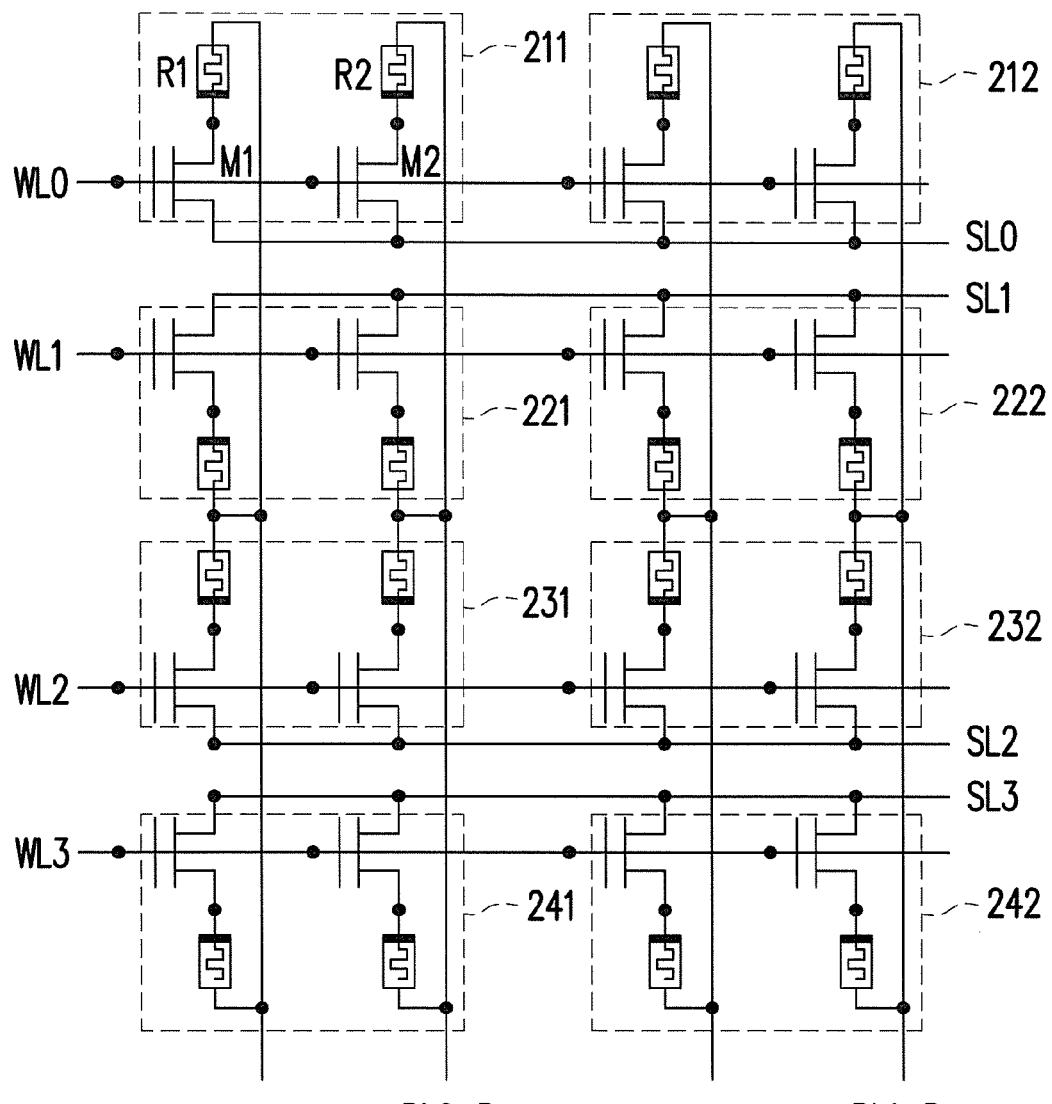
FIG. 2B is a schematic diagram illustrating the resistive memory apparatus of the embodiment of FIG. 2A according to another implementation.

Referring to FIG. 2B, FIG. 2B is a schematic diagram illustrating the resistive memory apparatus of the embodiment of FIG. 2A according to another implementation. Unlike the resistive memory apparatus 210, in a resistive memory apparatus 220 depicted in FIG. 2B, each of the memory cell rows is coupled to an independent source line. More specifically, the memory cell row formed by the resistive memory cells 211 to 212 is coupled to the source line SL0; the memory cell row formed by the resistive memory cells 221 to 222 is coupled to the source line SL1; the memory cell row formed by the resistive memory cells 231 to 232 is coupled to the source line SL2; and the memory cell row formed by the resistive memory cells 241 to 242 is coupled to the source line SL3.

Figure 2C:
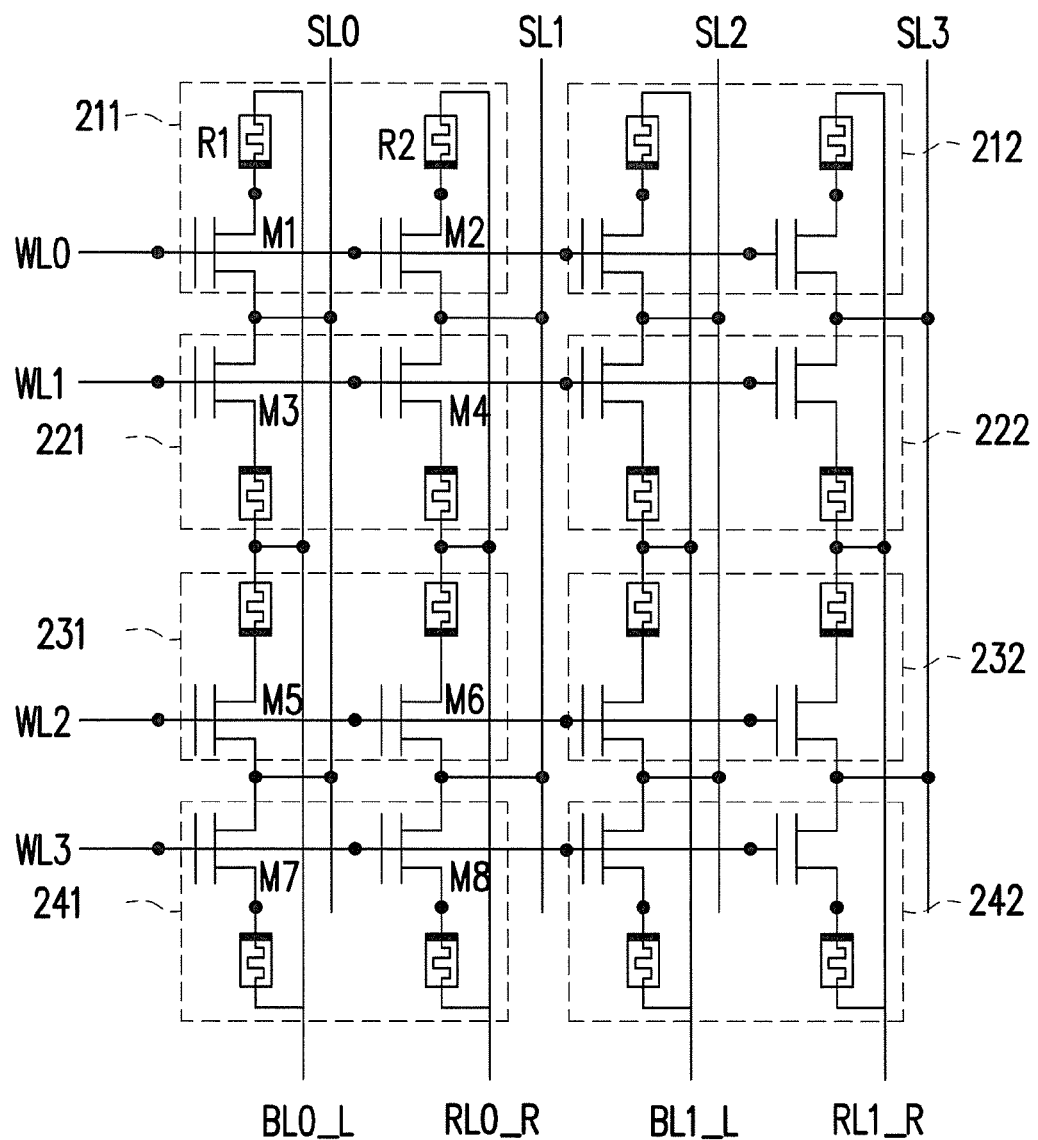
FIG. 2C is a schematic diagram illustrating the resistive memory apparatus of the embodiment of FIG. 2A according to yet another implementation.

Referring to FIG. 2B, FIG. 2B is a schematic diagram illustrating the resistive memory apparatus of the embodiment of FIG. 2A according to another implementation. In FIG. 2C, the source lines SL0 to SL3 are disposed in a direction not parallel to the word lines. Therein, the transistors arranged in opposite positions of the same memory cell column are connected to the same source line. More specifically, the resistive memory cells 211, 221, 231 and 241 arranged in the same memory cell column are used as an example for the description below. Therein, the transistor M1 of the resistive memory cell 211, a transistor M3 of the resistive memory cell 221 and a transistor M7 of the resistive memory cell 241 are coupled to the source line SL0; and the transistor M2 of the resistive memory cell 211, a transistor M4 of the resistive memory cell 221 and a transistor M6 of the resistive memory cell 241 are coupled to the source line SL1. With a disposition as depicted in FIG. 2C, take the resistive memory cell 211 as an example, in which the resistor R1 and the resistor R2 may be selected for accessing the data simultaneously, or the resistor R1 and the resistor R2 may be selected for accessing the data by time-division.

Figure 3A:
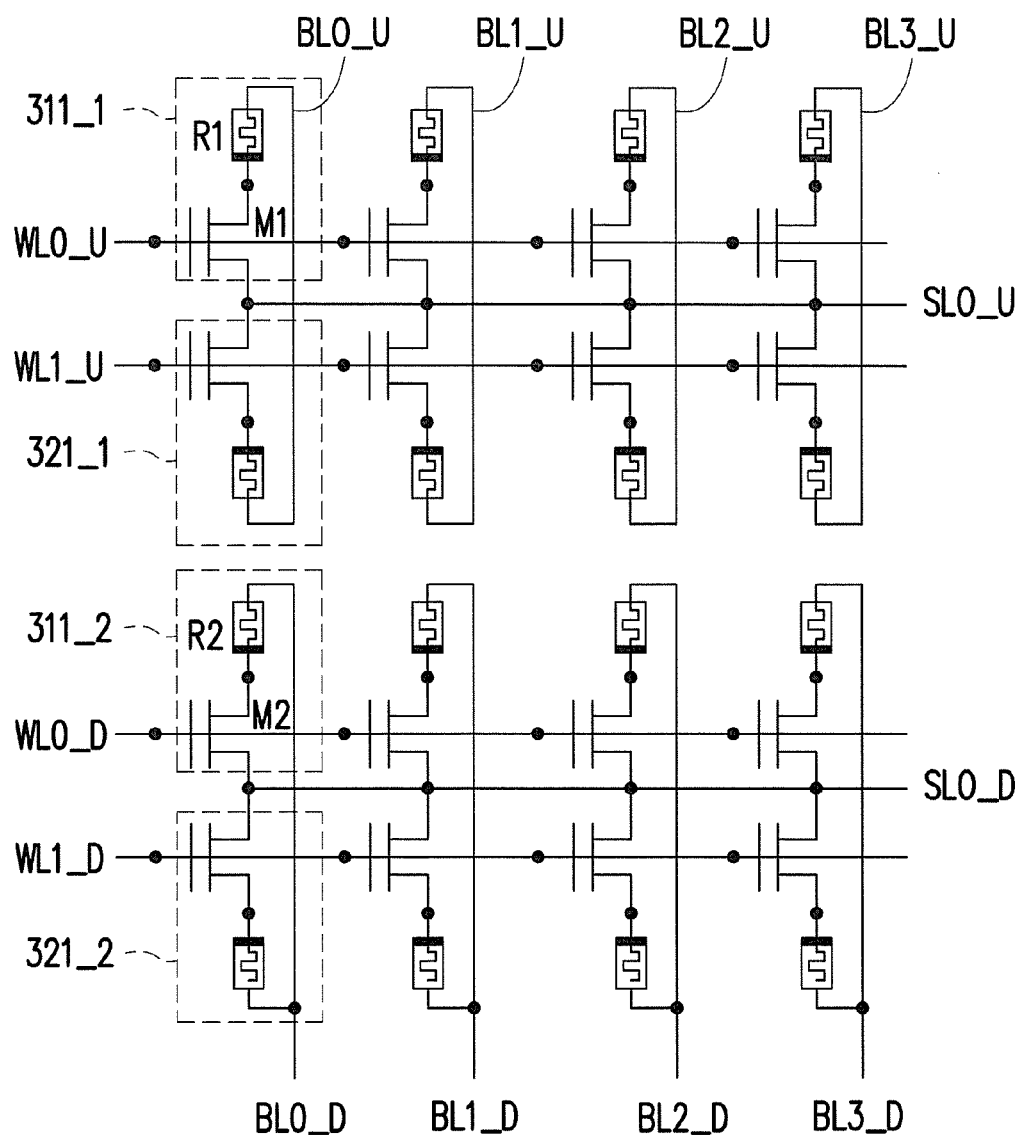
FIG. 3A is a schematic diagram illustrating a resistive memory apparatus according to another embodiment of the invention.

Referring to FIG. 3A, FIG. 3A is a schematic diagram illustrating a resistive memory apparatus according to another embodiment of the invention. A resistive memory apparatus 310 includes a plurality of resistive memory cells, and each of the resistive memory cells is divided into two parts to be disposed on different positions. In FIG. 3A, a partial resistive memory cell 311_1 and a partial resistive memory cell 311_2 are combined into one resistive memory cell, and a partial resistive memory cell 321_1 and a partial resistive memory cell 321_2 are combined into another resistive memory cell.

The partial resistive memory cell 311_1 and the partial resistive memory cell 311_2 are coupled to a sub word line WL0_U and a sub word line WL0_D, respectively. The transistor M1 in partial resistive memory cell 311_1 is turned on or off under control of the sub word line WL0_U, and the transistor M2 in the partial resistive memory cell 311_2 is turned on or off under control of the sub word line WL0_D. Similarly, the partial resistive memory cell 321_1 and the partial resistive memory cell 321_2 are coupled to a sub word line WL1_U and a sub word line WL1_D, respectively. The transistor in partial resistive memory cell 321_1 is turned on or off under control of the sub word line WL1_U, and the transistor in the partial resistive memory cell 321_2 is turned on or off under control of the sub word line WL1_D. Dispositions for the word lines of the rest of the resistive memory cells are similar to the disposition for the word lines of abovesaid resistive memory cell, thus related description is omitted hereinafter.

Furthermore, in the present embodiment, the neighboring partial resistive memory cells 311_1 and 321_1 are commonly coupled to a source line SL0_U, and the neighboring partial resistive memory cell 311_2 and 321_2 are commonly coupled to a source line SL0_D; and the neighboring partial resistive memory cells 311_1 and 321_1 are commonly coupled to a bit line BL0_U, and the neighboring partial resistive memory cell 311_2 and 321_2 are commonly coupled to a bit line BL0_D. The rest of bit lines BL1_U to BL3_U and bit lines BL1_D to BL3_D are coupled to the rest of partial resistive memory cells, respectively. Naturally, in other embodiments of the invention, the neighboring partial resistive memory cells are also coupled to different source lines, respectively, and a disposition thereof is similar to that in FIG. 2B, thus related description is omitted hereinafter.

In view of a circuit structure in FIG. 3A, it can be known that, the two partial resistive memory cells of the one single resistive memory cell are under control of different sub word lines, respectively. Therefore, the storing data of two bits as stored in the one single resistive memory cell may be read separately. Further, when writing data into the resistive memory cell, take the resistive memory cell composed of the partial resistive memory cells 311_1 and 311_2 as an example, one of the partial resistive memory cells 311_1 and 321_1 may be reset or set while another one of the partial resistive memory cells 311_1 and 311_2 may be set or reset simultaneously. This may effectively increase the data writing speed.

Naturally, setting or resetting of the partial resistive memory cells 311_1 and 321_1 may also done by time-division, which is not particularly limited in the invention.

Figure 3B:
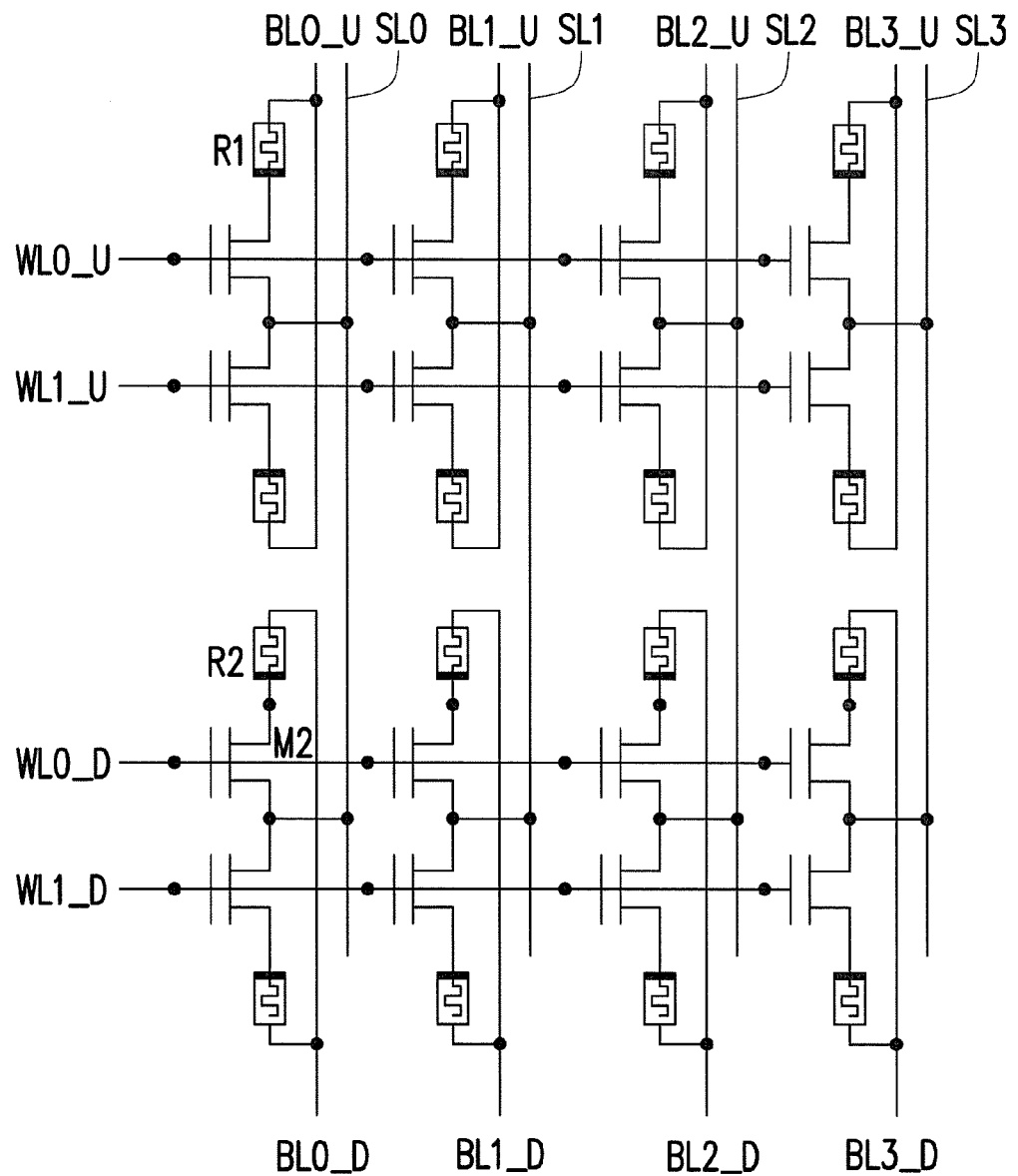
FIG. 3B is a schematic diagram illustrating the resistive memory apparatus of the embodiment of FIG. 3A according to another implementation.

Referring to FIG. 3B, FIG. 3B is a schematic diagram illustrating the resistive memory apparatus of the embodiment of FIG. 3A according to another implementation. Therein, source lines of a resistive memory apparatus 320 in FIG. 3B may be disposed in a direction not parallel to the word lines. Further, the partial resistive memory cells disposed at the same memory cell column may be coupled to the same source line.

In view of the implementations depicted in FIGS. 2A, 2B, 2C, 3A and 3B, it can be known that the disposition of the source lines in the resistive memory apparatus according to the embodiments of the invention is not limited by only one method. Any dispositions of the source lines for memories known by person skilled in the art may be applied for the invention, and are not described in details herein.

Figure 4:
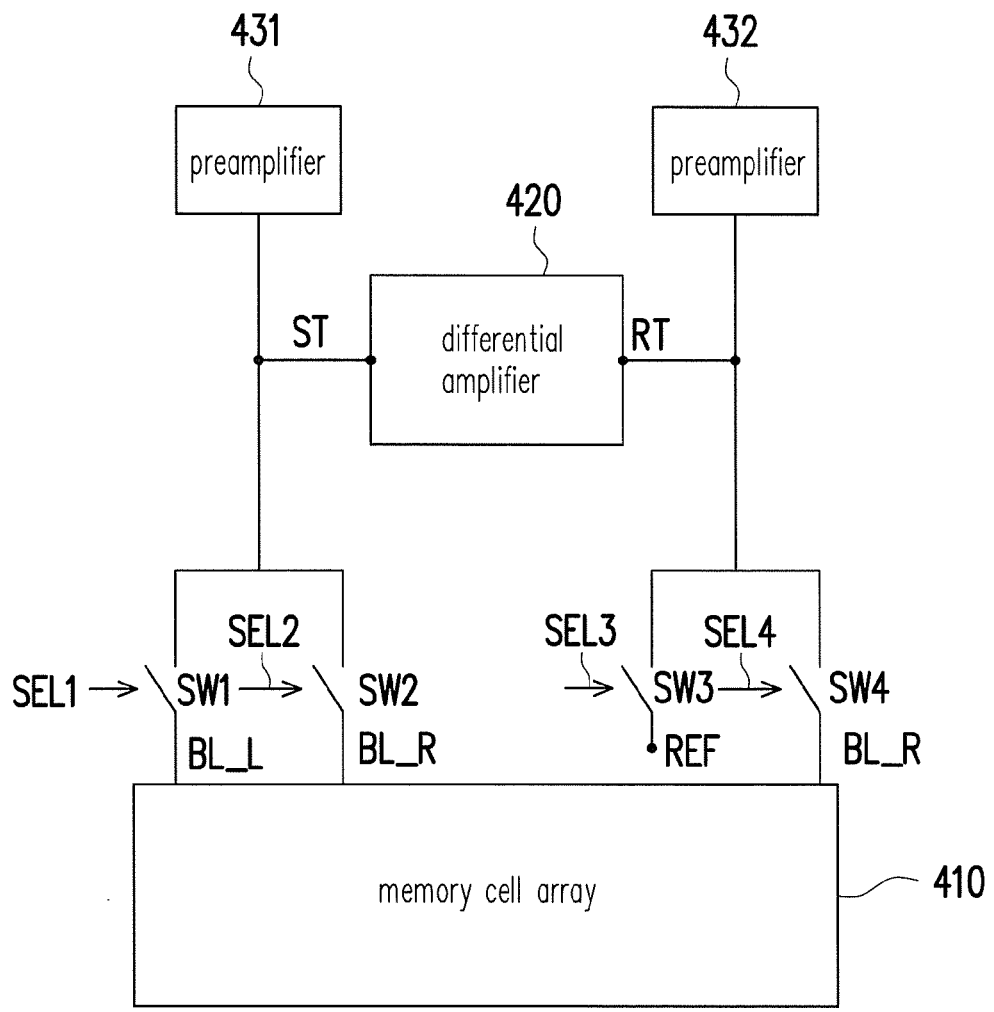
FIG. 4 is a schematic diagram illustrating a resistive memory apparatus according to yet another embodiment of the invention.

Referring to FIG. 4, FIG. 4 is a schematic diagram illustrating a resistive memory apparatus according to yet another embodiment of the invention. A resistive memory apparatus 400 includes a memory cell array 410, a differential amplifier 420, preamplifiers 431, 432 and switches SW1 to SW4. The differential amplifier 420 is coupled to bit lines BL_L and BL_R in the memory cell array 410 through the switches SW1 to SW3. The switch SW1 is used to select one of the bit lines BL_L and BL_R according to a selection signal SEL1 and an inversed signal SEL2 of the selection signal SEL1 for coupling to a sensing terminal ST on the differential amplifier 420. The switches SW4 and SW3 are used to select the bit line BL_R or a preset reference signal line REF respectively according to a selection signal SEL4 and an inversed signal SEL3 of the selection signal SEL4 for coupling to a reference terminal RT on the differential amplifier 420. Therein, the preset reference signal line REF is used to transmit a preset reference signal.

In the present embodiment, the selection signals SEL1 to SEL4 may be decided according to an amount of data bits stored in one single resistive memory cell. In case the one single resistive memory cell stores one single data bit, the switches SW1 and SW4 may be turned on according to the selection signals SEL1 and SEL4, and the switches SW2 and SW3 may be cut off according to the selection signals SEL2 and SEL3. Accordingly, the differential amplifier 420 may receive the current on the bit lines BL_L and BL_R for comparison, so as to know of the data bit stored by the resistive memory cell.

In case a plurality of data bits are stored by the one single resistive memory cell, the switches SW3 may be turned on according to the selection signal SEL3, and the switch SW4 may be cut off according to the selection signal SEL4. Further, the switches SW1 and SW2 may be turned on in sequence when the switch SW4 is turned on, so that electrical properties on the bit line BL_L ad the bit line BL_R may be compared with the preset reference signal provided by the preset reference signal line REF by time-division, so as to obtain the data bit of two bits.

Naturally, the sequence for turning on the switches SW1 and SW2 may be changed, or only one of the switches SW1 and SW2 needs to be turned on when only one of the two bits in the storing data is to be read.

In summary, the invention provides a resistive memory cell composed of two transistors and two resistors. Accordingly, reading errors on storing data may be avoided by comparing impedance values provided by the two resistors, and reading the storing data in the resistive memory cell according to a result of said comparison.

What is claimed is:

1. A resistive memory cell, comprising:
a first transistor having a first terminal, a second terminal and a control terminal, the first terminal and the second terminal of the first transistor being respectively coupled to a first bit line and a reference voltage, and the control terminal of the first transistor receiving a word line signal;
a second transistor having a first terminal, a second terminal and a control terminal, the first terminal and the second terminal of the second transistor being respectively coupled to a second bit line and the reference voltage, and the control terminal of the second transistor receiving the word line signal;
a first resistor serially coupled on a coupling path between the first terminal of the first transistor and the first bit line, or on a coupling path between the second terminal of the first transistor and the reference voltage; and
a second resistor serially coupled on a coupling path between the first terminal of the second transistor coupled and the second bit line, or on a coupling path between the second terminal of the second transistor and the reference voltage,
wherein when the resistive memory cell is selected for reading, the first and the second transistors are turned on according to the word line signal, and impedance states of the first resistor and the second resistor are provided through the first bit line and the second bit line respectively,
wherein the impedance states of the first resistor and the second resistor indicate a storing data stored by the resistive memory cell.

2. The resistive memory cell of claim 1, wherein when an impedance value of the first resistor is higher than an impedance value of the second resistor, the storing data is of a first logic level; and when the impedance value of the first resistor is lower than the impedance value of the second resistor, the storing data is of a second logic level.

3. The resistive memory cell of claim 1, wherein when impedance values of the first resistor and the second resistor are both greater than a first threshold impedance value, the storing data is of a first logic level; and when the impedance values of the first resistor and the second resistor are both less than a second threshold impedance value, the storing data is of a second logic level.

4. The resistive memory cell of claim 1, wherein the impedance states of the first resistor and the second resistor respectively indicate a plurality of storing data stored by the resistive memory cell.

5. A resistive memory apparatus, comprising:
a plurality of resistive memory cells arranged in a memory array, and the memory array having a plurality of memory cell columns and a plurality of memory cell rows.
a plurality of word lines respectively coupled to the memory cell rows for respectively transmitting a plurality of word line signals;
a plurality bit line pairs respectively coupled to the memory cell columns; and
a plurality of source lines respectively coupled to the resistive memory cells,
wherein each of the resistive memory cells comprises:
  a first transistor having a first terminal, a second terminal and a control terminal, the first terminal and the second terminal of the first transistor being respectively coupled to a first bit line and the corresponding source line, and the control terminal of the first transistor receiving one of the word line signal;
  a second transistor having a first terminal, a second terminal and a control terminal, the first terminal and the second terminal of the second transistor being respectively coupled to a second bit line and the corresponding source line, and the control terminal of the second transistor receiving the word line signal;
  a first resistor serially coupled on a coupling path between the first terminal of the first transistor and the first bit line, or on a coupling path between the second terminal of the first transistor and the corresponding source line; and
  a second resistor serially coupled on a coupling path between the first terminal of the second transistor and the second bit line, or on a coupling path between the second terminal of the second transistor and the corresponding source line,
wherein the impedance states of the first resistor and the second resistor of each of the resistive memory cells indicate a storing data stored by the resistive memory cell.

6. The resistive memory apparatus of claim 5, further comprising:
a differential amplifier coupled to the bit line pairs, the differential amplifier receiving a selection signal, the differential amplifier comparing signals from the first bit line and the second bit line in each of the bit line pairs according to the selection signal thereby obtaining a first storing data, or the differential amplifier comparing signals on the first bit line and the second bit lines with a preset reference signal according to the selection signal thereby obtaining a plurality of second storing data.

7. The resistive memory apparatus of claim 5, wherein each of the bit lines comprises a first sub word line and a second sub word line, wherein each of the resistive memory cells comprises the control terminal of the first transistor coupled to the first sub word line of the corresponding word line, and the control terminal of the second transistor coupled to the second sub word line of the corresponding word line; and each of the source lines comprises a first sub source line and a second sub source line, wherein each of the resistive memory cells comprises the second terminal of the first transistor coupled to the first sub source line of the corresponding source line, and the second terminal of the second transistor coupled to the second sub source line of the corresponding source line.

8. The resistive memory apparatus of claim 5, wherein when an impedance value of the first resistor is higher than an impedance value of the second resistor, the storing data is of a first logic level; and when the impedance value of the first resistor is lower than the impedance value of the second resistor, the storing data is of a second logic level.

9. The resistive memory apparatus of claim 5, wherein when impedance values of the first resistor and the second resistor are both greater than a threshold impedance value, the storing data is of a first logic level; and when the impedance values of the first resistor and the second resistor are both less than the threshold impedance value, the storing data is of a second logic level.

10. The resistive memory apparatus of claim 5, wherein the impedance states of the first resistor and the second resistor of each of the resistive memory cells respectively indicate a plurality of storing data stored by the resistive memory cell.

* * * * *